(12) United States Patent
Park et al.

(10) Patent No.: US 9,306,777 B2
(45) Date of Patent: Apr. 5, 2016

(54) DIRECT CONVERSION RECEIVER INCLUDING A CHARGE AREA DECIMATION FILTER

(71) Applicant: Electronics and Telecommunications Research Institute, Daejeon (KR)

(72) Inventors: Jung Woo Park, Daejeon (KR); Young Jae Lee, Daegu (KR); Hyun Kyu Yu, Daejeon (KR); Byung Hun Min, Jeollabuk-do (KR); Seong Do Kim, Daejeon (KR); Hoai Nam Nguyen, Daejeon (KR); Sang Gug Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/183,513

(22) Filed: Feb. 18, 2014

(65) Prior Publication Data

US 2014/0169512 A1    Jun. 19, 2014

Related U.S. Application Data

(62) Division of application No. 12/970,899, filed on Dec. 16, 2010, now abandoned.

(30) Foreign Application Priority Data

Dec. 18, 2009  (KR) .................. 10-2009-0127539
Nov. 18, 2010  (KR) .................. 10-2010-0115078

(51) Int. Cl.
*H04B 1/26*   (2006.01)
*H04L 25/08*  (2006.01)
*H03H 19/00*  (2006.01)
*H03D 7/14*   (2006.01)

(52) U.S. Cl.
CPC .............. *H04L 25/08* (2013.01); *H03D 7/1441* (2013.01); *H03D 7/1458* (2013.01); *H03H 19/004* (2013.01)

(58) Field of Classification Search
None
See application file for complete search history.

(56) References Cited

U.S. PATENT DOCUMENTS

| | | | |
|---|---|---|---|
| 6,856,925 B2 | 2/2005 | Muhammad et al. | |
| 7,902,923 B2 | 3/2011 | Li et al. | |
| 8,013,651 B2 | 9/2011 | Lee et al. | |
| 2003/0035499 A1 | 2/2003 | Staszewski et al. | |
| 2007/0077907 A1 | 4/2007 | Rector | |
| 2007/0152871 A1* | 7/2007 | Puglia | 342/70 |
| 2009/0033404 A1 | 2/2009 | Chan et al. | |
| 2009/0160577 A1 | 6/2009 | Yoshizawa et al. | |
| 2010/0316172 A1* | 12/2010 | Keehr et al. | 375/344 |
| 2011/0051639 A1* | 3/2011 | Ramakrishnan et al. | 375/316 |

OTHER PUBLICATIONS

Loic Joet et al., "Advanced 'Fs/2' Discrete-Time GSM Receiver in 90-nm CMOS", ASSCC, pp. 371-374, 2006.

* cited by examiner

*Primary Examiner* — Lana N Le
(74) *Attorney, Agent, or Firm* — Rabin & Berdo, P.C.

(57) ABSTRACT

A direct conversion receiver includes: a high linearity mixer device including a sampler unit charge-sampling an input current according to a sampling frequency, and a buffer unit receiving an output signal from the sampler unit while having a low input impedance, amplifying the received signal, and outputting a current signal; and a filter device decimating an output signal from the mixer device and FIR-filtering the decimated signal.

8 Claims, 11 Drawing Sheets

DIRECT CONVERSION RECEIVER INCLUDING A CHARGE AREA DECIMATION FILTER

CROSS-REFERENCE TO RELATED APPLICATIONS

This application is a divisional of application Ser. No. 12/970,899 filed on Dec. 16, 2010. Furthermore, this application claims the benefit priority of Korean Patent Application Nos. 10-2009-0127539 filed on Dec. 18, 2009 and 10-2010-0115078 filed on Nov. 18, 2010. The disclosures of these prior U.S. and Japanese applications are incorporated herein by reference.

BACKGROUND OF THE INVENTION

1. Field of the Invention

The present invention relates to a direct conversion receiver and, more particularly, to a discrete-time direct conversion receiver having excellent adaptability and applied to a wireless communication terminal.

2. Description of the Related Art

In general, a charge sampling receiver includes a sampler performing frequency down-conversion and signal sampling. The sampler performs signal sampling by using voltage sampling or charge sampling.

A charge sampling mixer has aliasing and noise folding elimination characteristics installed therein, having an excellent effect as a sampler compared with a voltage sampling mixer.

A conversion gain of a direct conversion down-sampling mixer is represented by Equation 1 shown below:

$$CG = \frac{v_{IF}}{v_{RF}} = \frac{2}{\pi} \frac{G_m}{f_S \cdot C_S} \quad \text{[Equation 1]}$$

Here, $G_m$ is transconductance of a transconductor, $f_s$ is a sampling frequency, and $C_s$ is capacitance of a sampling capacitor.

According to Equation 1, the conversion gain of an aliasing elimination filter in the form of a first-order sinc filter installed in the charge sampling mixer has frequency dependency. Thus, because the conversion gain of the anti-aliasing sinc filter installed in the charge sampling mixer has frequency dependency characteristics, it is difficult to apply the related art charge sampling receiver to a broadband application such as a digital TV tuner having a frequency band ranging from tens MHz to a few GHz.

Another drawback of the charge sampling mixer is linearity characteristics. In the broadband application, linearity characteristics are one of the most important specifications because the linearity characteristics are related to blocking interferences. The swing of outputs from the transconductance amplifying stage and the sampling mixer is significantly limited due to the linearity characteristics of the receiver.

SUMMARY OF THE INVENTION

An aspect of the present invention provides a structure in which the broadband characteristics and linearity (swing range) of a mixing stage and a sampling filter are improved under the conditions of a low power consumption and a low supply voltage.

According to an aspect of the present invention, there is provided a high linearity mixer device including: a sampler unit charge-sampling an input current according to a sampling frequency; and a buffer unit receiving an output signal from the sampler unit while having a low input impedance, amplifying the received signal, and outputting a current signal.

According to another aspect of the present invention, there is provided a direct conversion receiver including: a high linearity mixer device including a sampler unit charge-sampling an input current according to a sampling frequency, and a buffer unit receiving an output signal from the sampler unit while having a low input impedance, amplifying the received signal, and outputting a current signal; and a filter device decimating an output signal from the mixer device and FIR-filtering the decimated signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions may be exaggerated for clarity, and the same reference numerals will be used throughout to designate the same or like components.

Unless explicitly described to the contrary, the word "comprise" and variations such as "comprises" or "comprising," will be understood to imply the inclusion of stated elements but not the exclusion of any other elements.

Figure 1:
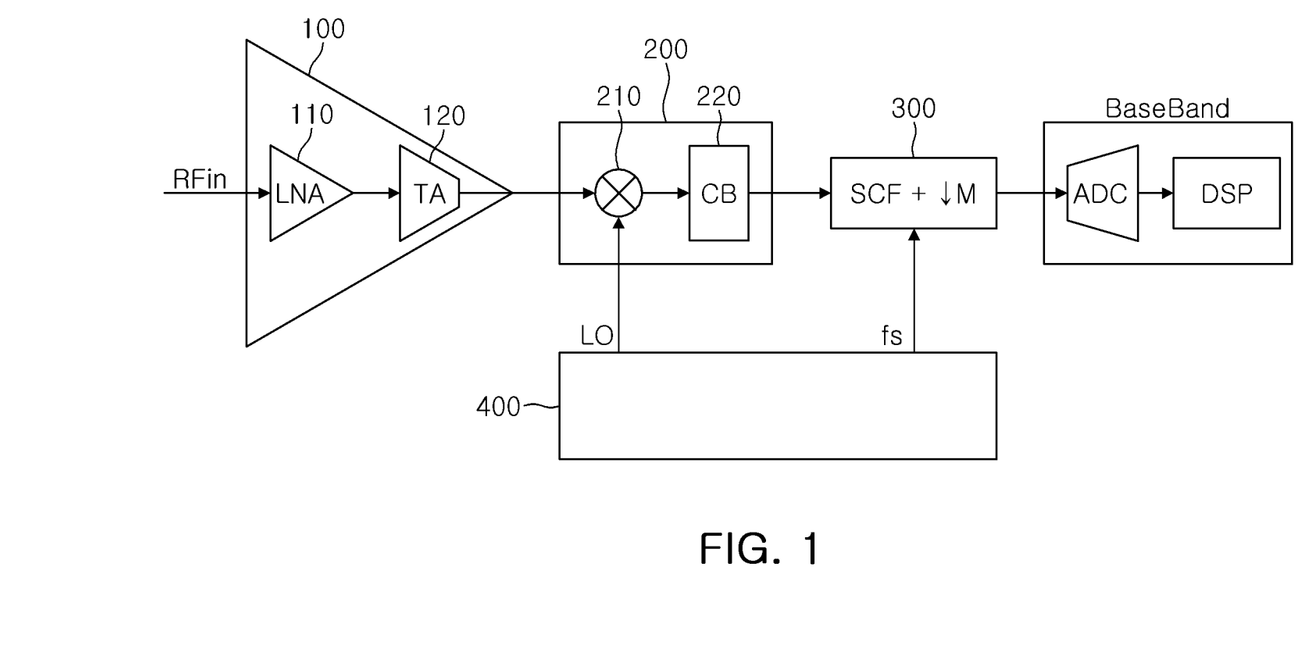
FIG. 1 is a schematic functional block diagram of a direct conversion receiver including a high linearity mixer according to an exemplary embodiment of the present invention.

FIG. 1 is a schematic functional block diagram of a direct conversion receiver including a high linearity mixer according to an exemplary embodiment of the present invention.

With reference to FIG. 1, a direct conversion receiver according to an exemplary embodiment of the present invention may be configured to include a high linearity mixer device 200 and a filter device 300. Also, the direct conversion receiver may further include a local oscillation device 400 supplying a sampling signal to the high linearity mixer device 200 and the filter device 300. Also, the direct conversion receiver may further include an amplifying device 100 provided at a receiver front end to amplify a received signal.

In general, in order to operate a mixer and a filter in a charge domain, an input signal must be a current signal, rather than a voltage signal. Thus, preferably, a transconductance amplifier 120 is provided at a front stage of the high linearity mixer device 200.

Also, a low-noise amplifier 110 is generally disposed at a front stage of the transconductance amplifier 120 in the direct conversion receiver, because a received RF signal has a low signal strength and a high noise strength.

Preferably, the high linearity mixer device 200 is implemented as a mixer outputting a current signal in the form of a current commutating passive mixer or a charge sampler, rather than as a typical mixer outputting a voltage signal.

When the mixer device 200 is designed in the form as described above, its conversion gain is given as Equation 2, shown below:

$$CG = \frac{v_{IF}}{v_{RF}} = \frac{2}{\pi} \frac{G_m}{R_{eq}} \quad \text{[Equation 2]}$$

Here, $G_m$ is transconductance of a transconductor, and $R_{eq}$ is equivalent resistance of a switch capacitor network. The equivalent resistance $R_{eq}$ is a constant when a sampling rate and capacitance of a sampling capacitor are constants.

Thus, when the mixer device 200 is designed as described above, because the frequency characteristics are not dependent upon the sampling frequency, the frequency characteristics can be improved.

Also, in order to achieve high linearity, in an exemplary embodiment of the present invention, a mixer is terminated by using a buffer performing current amplification while having a low input impedance, instead of terminating the mixer by using a typically used transimpedance amplifier. One example of the buffers having the foregoing characteristics is a common-gate amplifier.

To this end, the mixer device 200 may include a sampler unit 210 and a buffer unit 220.

The filter device 300 performs FIR filtering to eliminate high-frequency components from an output signal of the mixer device 200 and decimation to lower a high sampling rate.

In order to meet the conditions of low power and low supply voltage, preferably, the filter device 300 is designed as a charge domain decimation filter. When the filter device 300 is designed as a charge domain decimation filter, it is composed of switches and capacitors in order to lower circuit complexity. In this case, however, clocks for controlling switches must generate accurate timing.

The signal, which has passed through the filter device 300, is transmitted to digital signal processing devices (an ADC (Analog-to-Digital Converter), a DSP (Digital Signal Processor), and the like).

Figure 2:
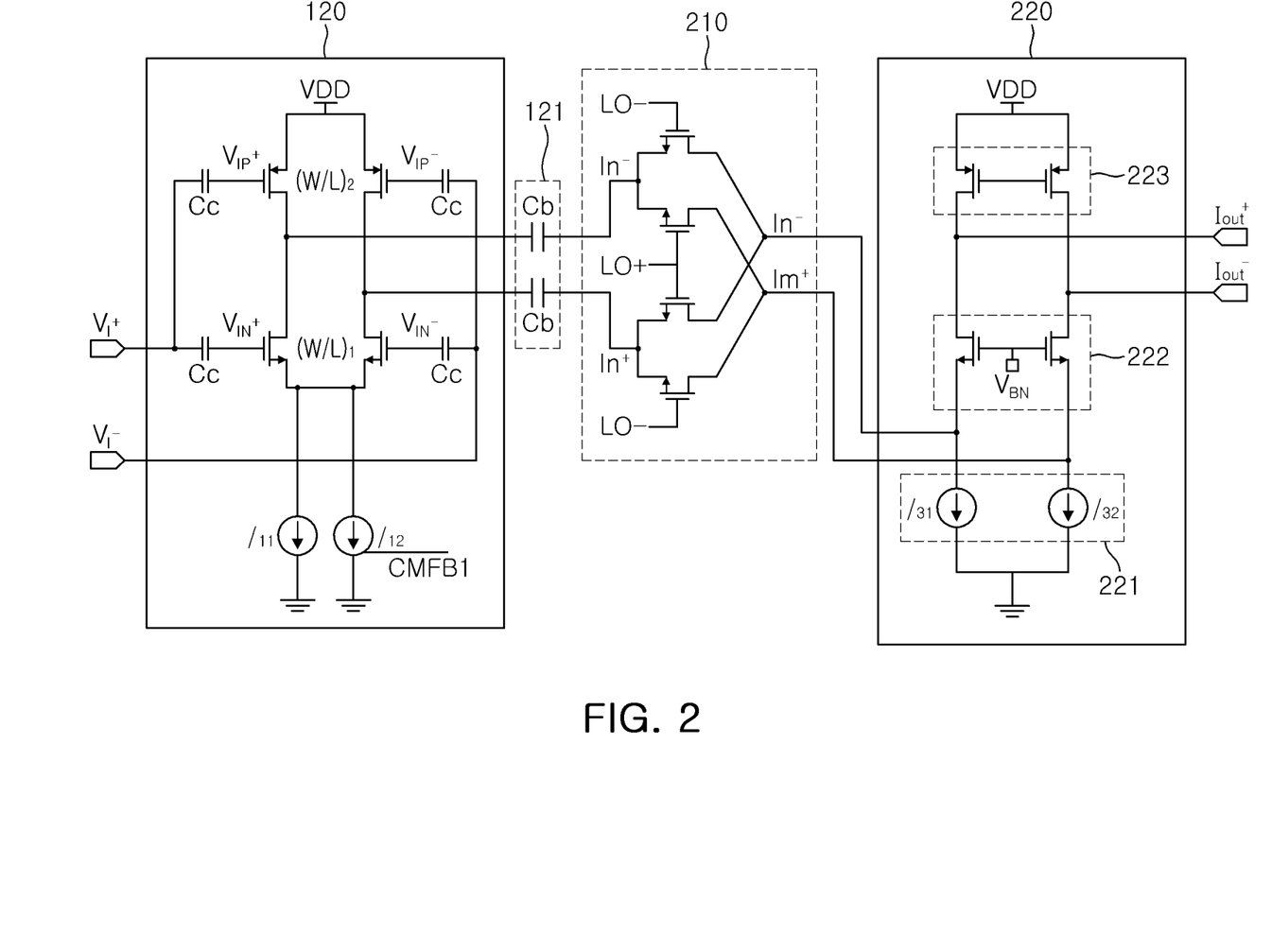
FIG. 2 is a schematic functional block diagram of a mixer device used in the direct conversion receiver according to an exemplary embodiment of the present invention.

FIG. 2 is a schematic functional block diagram of a mixer device used in the direct conversion receiver according to an exemplary embodiment of the present invention.

With reference to FIG. 2, the mixer device 200 according to an exemplary embodiment of the present invention may be configured to include a sampler unit 210 and a buffer unit 220.

The transconductance amplifier 120 receives voltage inputs Vi+ and Vi− and outputs a current signal. A bypass capacitor 121 eliminates a DC component of a signal output from the transconductance amplifier 120.

The sampler unit 210 mixes an input signal and a local oscillation signal to generate a discrete-time current signal. To this end, the sampler unit 210 may be implemented as a switching element and perform sampling according to a clock for controlling a switching operation. Preferably, the frequency of the clock for controlling the switching operation is equal to a sampling frequency.

In the case of the switching element, it is preferably implemented as a MOSFET, in consideration of the degree of integration and design convenience. When a control clock is input to a gate of the MOSFET and a current signal is input to a source of the MOSFET, the MOSFET performs a sampling operation on the input current signal according to the control clock. Namely, the MOSFET performs an operation as a switching element. Also, the MOSFET is cost-effective because its structure is simple in design, and because the designing of an allowable current, a gain, and the like, of the MOSFET are easily implemented through simply changing a width-to-length (W/L) ratio, providing ease of design. The sampler unit 210 illustrated in FIG. 2 is a double-balanced mixer implemented by using the MOSFET, a switching element. A detailed operation thereof will be described later with reference to FIG. 3.

In addition, when the sampler unit 210 is designed as a mixer in the form of charge sampling, frequency characteristics can be improved as mentioned above with reference to FIG. 1.

However, when the sampler unit 210 is implemented as the foregoing switching element (in particular an amplifying element such as a MOSFET, or the like), as the swing range of an input/output terminal increases, linearity deteriorates due to the element characteristics. Thus, in order to achieve signal processing within the linear section, the impedance of the input/output terminal must be set to be low. Also, the swing range of the output terminal of the transconductance amplifier 100 must not be high. Thus, a circuit at the next stage of the sampler unit 210 is required to have a low input impedance.

Thus, for those reasons as described above, the buffer unit 220 has a low impedance, and because signal characteristics are not good due to the narrow swing range of the output from the sampler unit 210, the buffer unit 220 may even perform a function of amplifying the signal.

In general, the mixer end is terminated by a transimpedance amplifier TIA; however, due to the characteristics of the transimpedance amplifier, output characteristics function as a voltage source, rather than as a current source. Thus, it is problematic that for a connection with the filter device 300 performing filtering by using a current signal, a baseband transconductance amplifier is additionally needed.

Thus, the mixer device, according to an exemplary embodiment of the present invention, is implemented to include the buffer unit 220 supplying current through current amplification to the filter device 300.

One example of a circuit which is able to implement the foregoing characteristics is a common gate amplifier. When a common gate amplifier is used, it may be implemented in the form of a cascode. Then, the current and impedance characteristics of the input/output terminal can be easily regulated, providing convenience in design. The buffer unit 220 illustrated in FIG. 2 is an example in which the common gate amplifier is implemented in the form of a cascode. A detailed operation thereof will be described later with reference to FIG. 4.

Figure 3A:
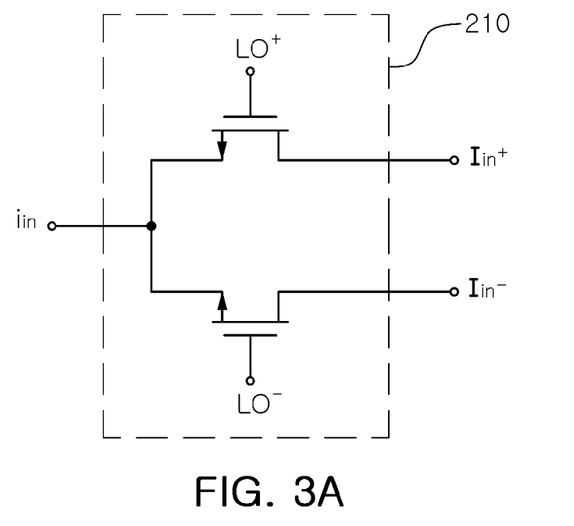
FIGS. 3A and 3B are views showing an implementation example of sampler unit at a circuit level in the mixer device according to an exemplary embodiment of the present invention.
Figure 3B:
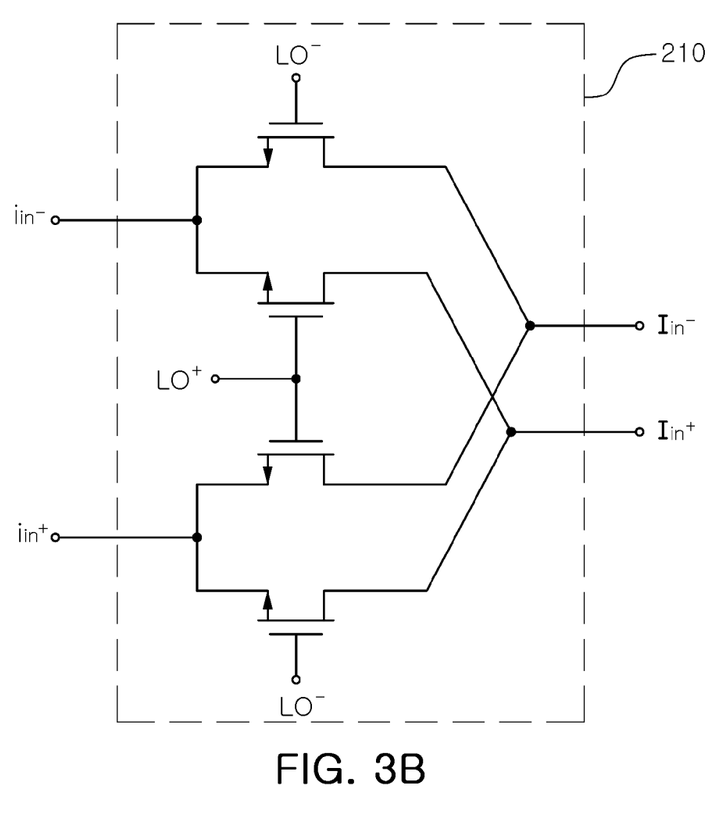

FIGS. 3A and 3B are views showing an implementation example of sampler unit at a circuit level in the mixer device according to an exemplary embodiment of the present invention.

With reference to FIG. 3A, the sampler unit 210 may be implemented in the form of a double balanced mixer by using two MOSFETs.

An input current signal is applied to a source terminal and a control signal is applied to a gate terminal. In a case in which the MOSFET used as a switching element is an NMOS, when the gate terminal has a high level, the signal from the source terminal can be transmitted to a drain terminal, so current can flow.

Because the MOSFET is operated as a switching element, an input signal $i_{in}$ is an analog signal, but output signals $I_{in+}$ and $I_{in-}$ are discrete-time signals.

With reference to FIG. 3B, in the sampler unit 210, the double-balanced mixer can be implemented as a current switching quad in the form of a differential circuit using four MOSFETs. When the double-balanced mixer is implemented as a differential circuit, it can cancel common mode noise, improving the noise characteristics. Thus, preferably, the sampler unit 210 is implemented in the form of a differential circuit.

Control signals L0+ and L0− input to the gate of the MOSFET are sampling signals generated from the local oscillation device 400. The control signals L0+ and L0− are clock signals having a 180-degree phase difference from each other.

Because the switching element is implemented as a MOSFET, if a swing range of an input signal or an output signal is large, linearity deteriorates due to the element characteristics. Thus, in order to improve the linearity of the input/output terminal, a signal having a narrow swing range must be received and a signal having a narrow swing range must be output. To this end, the output terminal is required to be terminated by a load having an impedance as low as 50 ohms to 100 ohms.

FIGS. 4A to 4D are views showing an implementation example of a buffer unit of the direct conversion receiver at a circuit level according to an exemplary embodiment of the present invention.

Figure 4A:
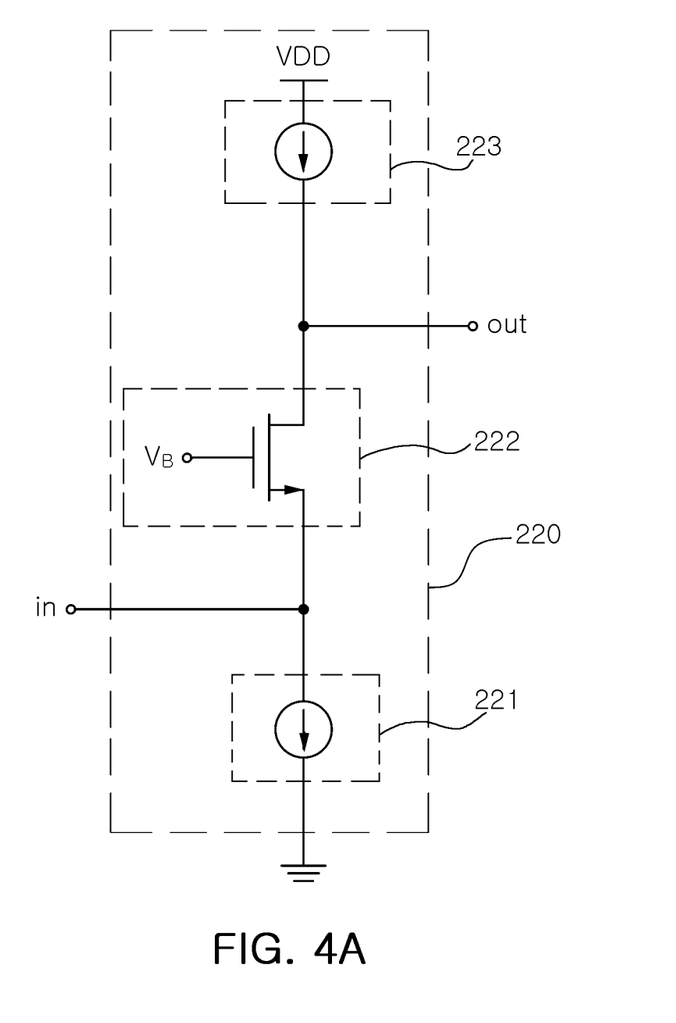
FIGS. 4A to 4D are views showing an implementation example of a buffer unit of the direct conversion receiver at a circuit level according to an exemplary embodiment of the present invention.

With reference to FIG. 4A, the buffer unit 220 according to an exemplary embodiment of the present invention includes an amplifying transistor 222, a current source 221 of a source terminal, and a current source 223 of a drain terminal, and is designed as a common gate amplifier in which an input is applied to the source terminal and then output to the drain terminal. The current sources 221 and 223 are provided at the source terminal and the drain terminal, and a bias voltage is applied to a gate terminal to bias the amplifier. Biasing must be set to have an output swing range sufficient for driving the following stage.

Because the amplitude of the signal input to the buffer unit 220 to improve linearity of the sampler unit 210 is sufficiently small, amplification of the input signal in the buffer unit can be recognized through a small signal analysis.

Input impedance seen at the input terminal is impedance connected in parallel to the impedance of the current source 221 and that of the amplifying transistor 222, which can be expressed as Equation 3 shown below:

$$Z_{in} \approx 1/g_m \qquad \text{[Equation 3]}$$

Because the value of gm in a typical amplifying transistor is large, the small signal input impedance of the common gate amplifier is sufficiently low, satisfying the characteristics required by the sampler unit 210.

Also, the output impedance of the common gate amplifier is dependent only upon the configuration of a current source, so desired output impedance can be easily designed.

One of the important characteristics required for the direct conversion receiver is noise, especially flicker noise. In order to eliminate the flicker noise, a design area of the amplifying transistor 222 may be increased. Also, the value gm for determining amplifying characteristics and input impedance can be easily determined by adjusting the width-to-length (W/L) ratio of the amplifying transistor 222.

Because the output from the buffer unit is in the form of a discrete-time signal, so preferably, the amplifying transistor is required to have a good amplifying performance. Thus, in order to lower the input impedance and improve the amplifying characteristics, preferably, the width-to-length ratio may be determined such that the value gm is sufficiently large.

Namely, the buffer unit 220 in the form of a common gate amplifier according to an exemplary embodiment of the present invention is one example of circuit configurations which simultaneously satisfies the impedance characteristics desired by the sampler unit 210, the impedance characteristics required for driving the next stage, and the amplifying characteristics.

Accordingly, the mixer device 200 having high linearity characteristics can be implemented by using the sampler unit 210 and the buffer unit 220 in conjunction.

Figure 4B:
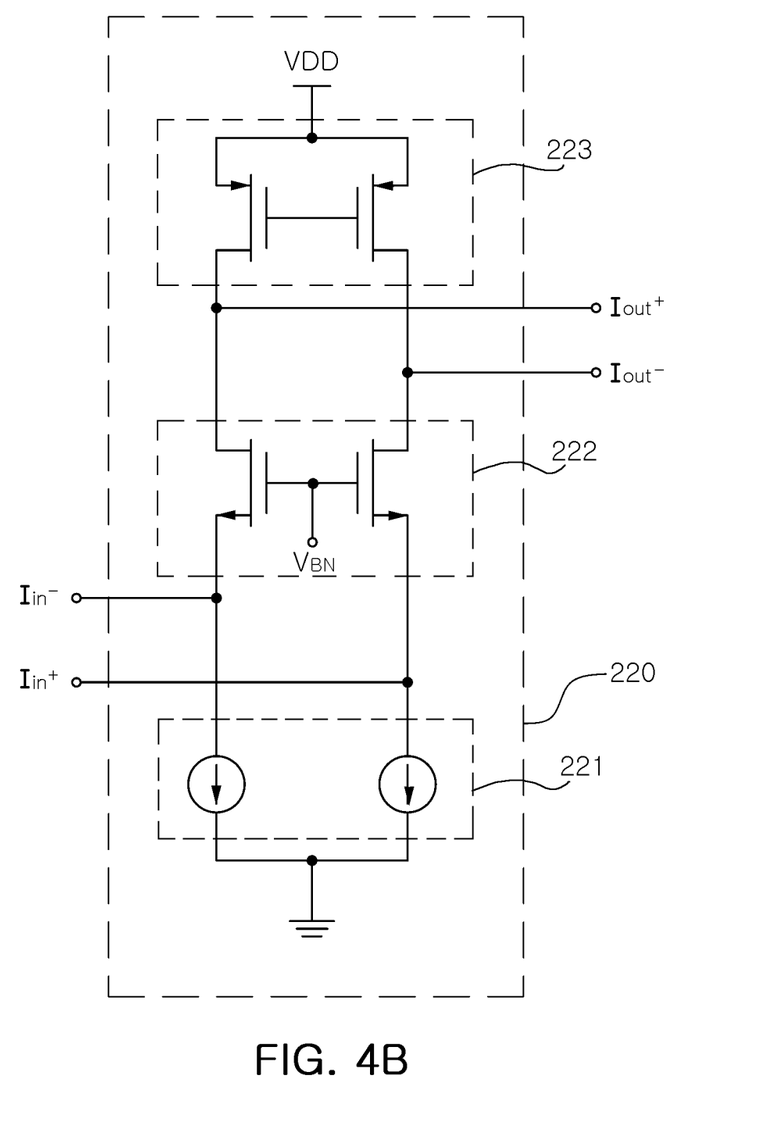

With reference to FIG. 4B, the buffer unit 220 according to an exemplary embodiment of the present invention may be implemented in the form of a differential common gate amplifier. Also, the drain terminal current source 223 may be implemented by using a current mirror structure, and in this case, when the drain current source 223 is implemented to have the current mirror structure, it can also perform a current feedback function between differential ends.

Input impedance and amplifying characteristics of the buffer unit 220 illustrated in FIG. 4B are similar to those of FIG. 4A. Output impedance is impedance of the current mirror structure.

Figure 4C:
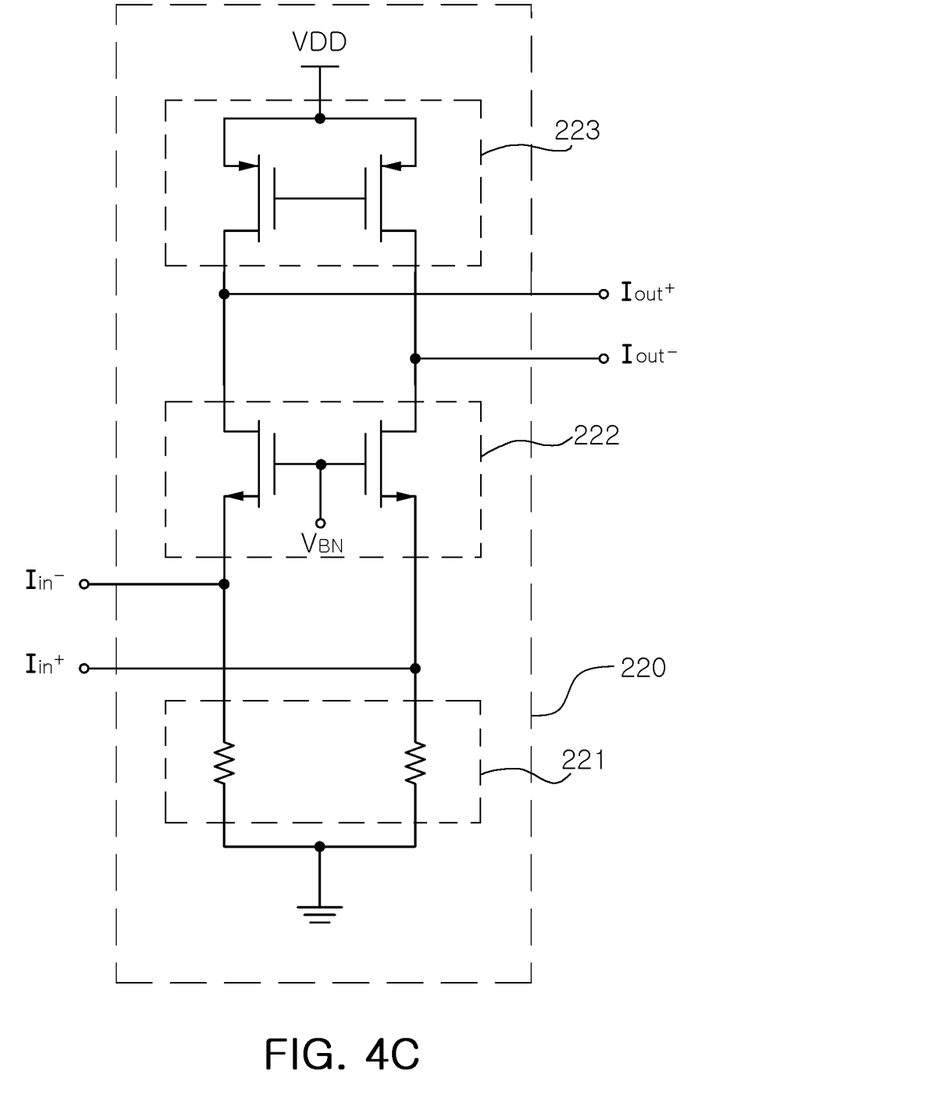

With reference to FIG. 4C, the source terminal current source 221 of the buffer unit 220 according to an exemplary embodiment of the present invention illustrated in FIG. 4B may be replaced with a load resistance having low impedance.

In this case, however, when implemented as shown in FIG. 4C, the size of the load resistance 221 must be sufficiently small in order to meet the bias conditions and low supply voltage requirements of the buffer unit. If the size of the load resistance is large, a voltage drop at the load resistance 221 is increased due to the large amount of current to be processed by the buffer unit 220, resulting in a failure to satisfy the bias conditions under the low supply voltage requirements.

Figure 4D:
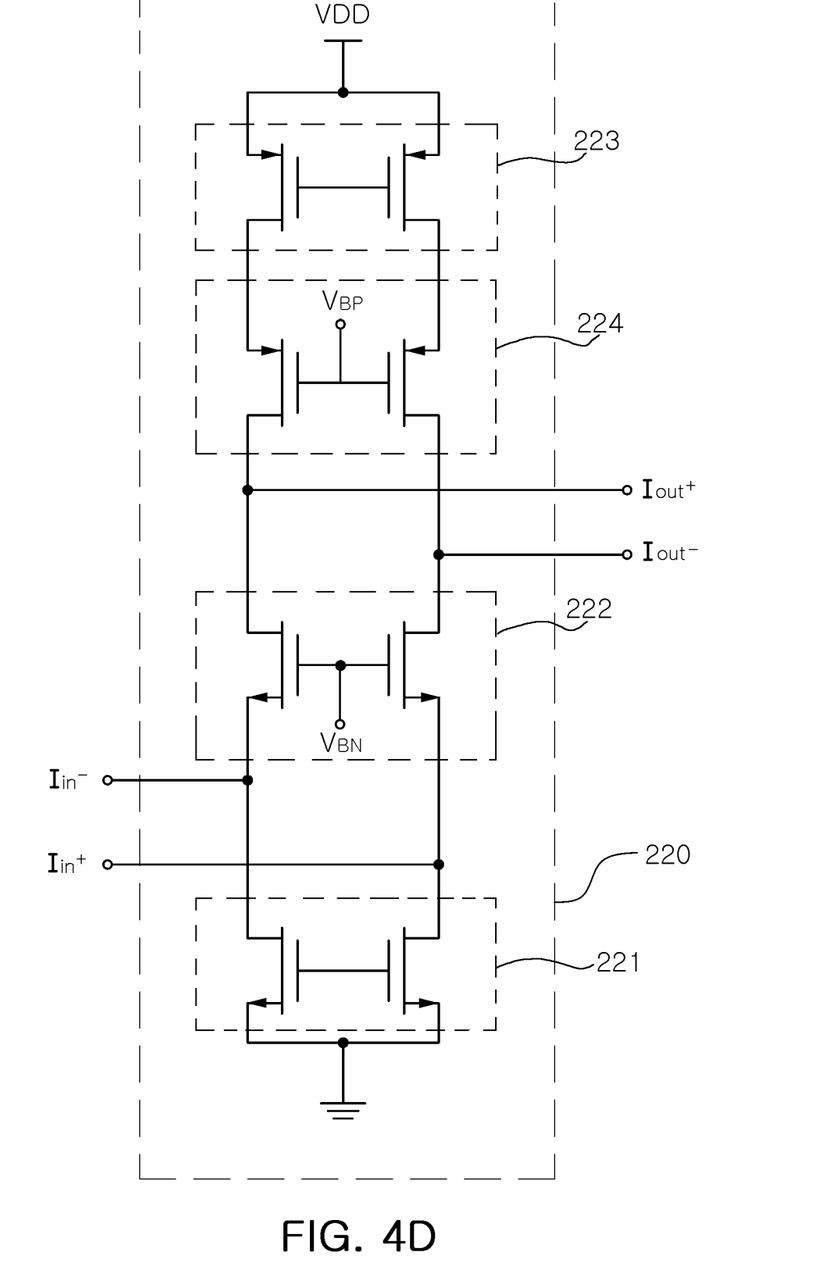

With reference to FIG. 4D, the buffer unit 220 according to an exemplary embodiment of the present invention illustrated in FIG. 4B may be modified into a form of a folded-cascode mixing OTA (Operational Transconductance Amplifier).

In order to improve the output impedance characteristics of the buffer unit 220, the current source of the drain terminal is changed into the form of cascodes 223 and 224. Accordingly, the output impedance characteristics of the buffer unit 220 can be improved.

Also, the current source 221 of the source terminal of the buffer unit 220 is implemented by using the current mirror structure.

Figure 5A:
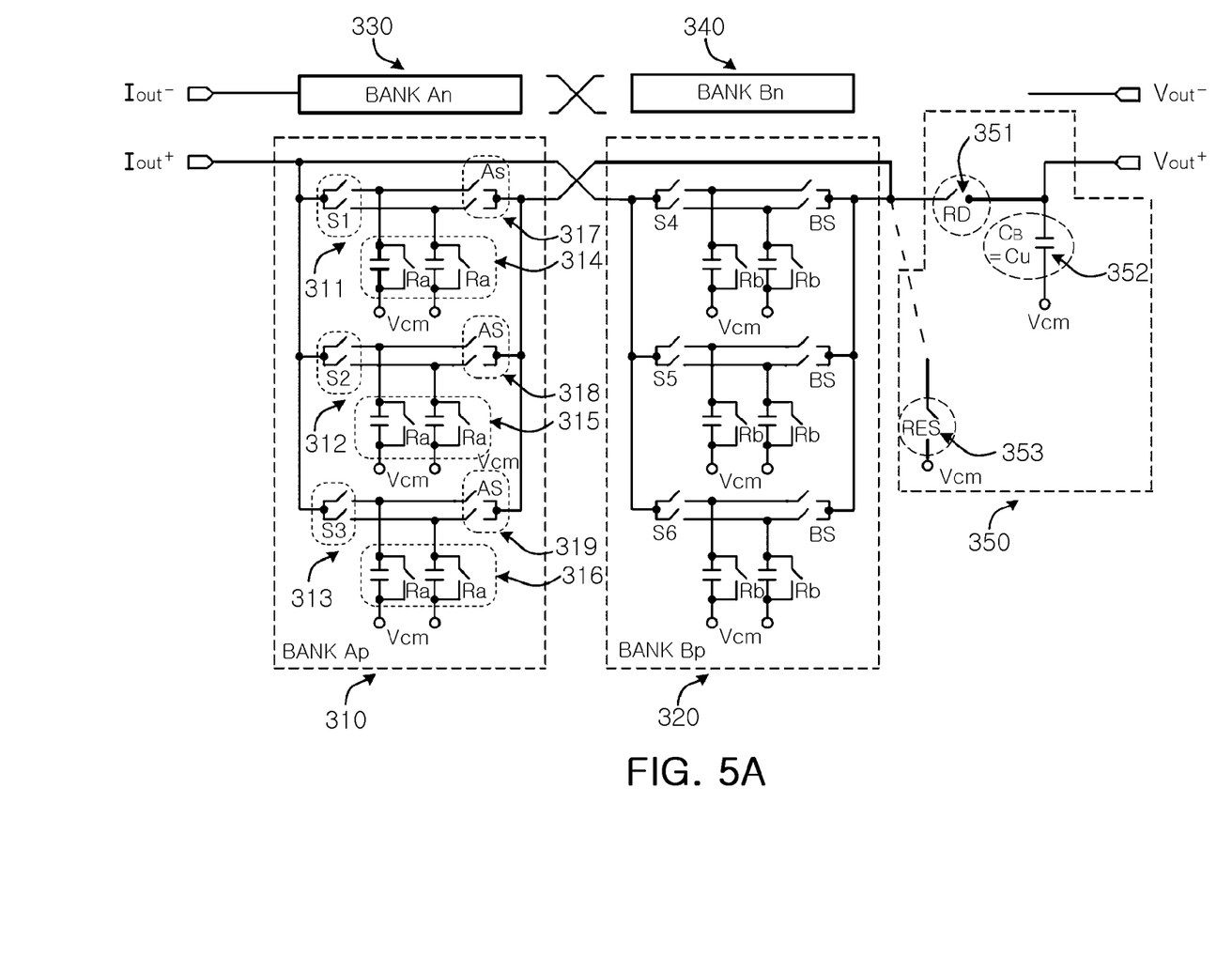
FIGS. 5A and 5B are views showing an implementation example of a filter device and a timing diagram of clocks for operating the device.

FIG. 5A is an implementation example of a filter device according to an exemplary embodiment of the present invention.

With reference to FIG. 5A, the filter device 300 according to an exemplary embodiment of the present invention is implemented as a charge domain decimation filter, including a plurality of banks including a switch and a capacitor and an output terminal including a switch and a capacitor.

In FIG. 5A, the filter device 300 includes four banks 310 to 340 each including three capacitor terminals 314, 315, and 316, three pairs of input switches 311, 312, and 313, and three pairs of output switches 317, 318, and 319, and an output terminal 350 including a capacitor 352 adding current signals, a switch 351 controlling a charge output, and a switch 353 discharging electrical charges charged in the capacitor 352.

The filter device 300 is an FIR filter operating in a time-interleave manner. In particular, when an input signal is a current signal, the merits of the sampler unit 210 having aliasing elimination characteristics according to an exemplary embodiment of the present invention can be utilized. Also, IIR filtering is performed at the capacitor 352 of the output terminal 350.

The operation of the three pairs of input switches 311, 312, and 313 is controlled by clock signals each having a different delay time and the same period.

The three capacitor terminals 314, 315, and 316 include two charge charging capacitors and two charge discharging switches, respectively. The operation of the charge discharging switches is controlled according to an Ra clock.

The three pairs of output switches 317, 318, and 319 control the transfer of charge charged in the respective connected capacitor into output terminal, and are controlled by a common clock.

Two charge paths are provided to transfer charges in the banks. Input and output switches are disposed on the charge paths, and the charging capacitors and discharging switches are connected on the respective charge paths between both switches.

The configuration and operation of the other banks 320 to 340 are the same.

The amount of charges charged in the capacitor terminals 314 to 316 and output to the output terminal 350 through the banks 310 to 340 are the same in each of the capacitor terminals. Namely, it is a circuit configuration for a first-order sinc filter.

Figure 5B:
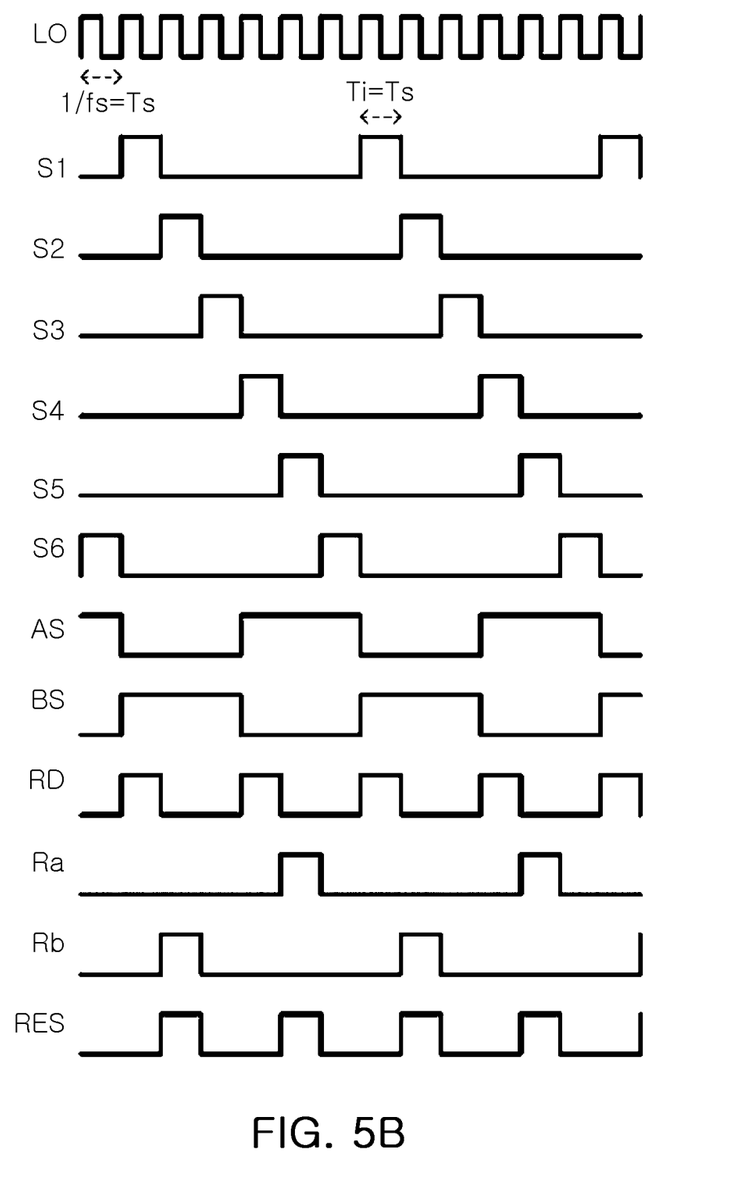

FIG. 5B is a timing diagram of the control clocks of the respective switches illustrated in FIG. 5A for the operation of the filter device according to an exemplary embodiment of the present invention.

With reference to FIG. 5B, S1 to S6 are delayed by one sampling period, respectively, and AS and BS are turned on during three sampling periods. Thus, the filter illustrated in FIG. 5A operates as an FIR filter, having a decimation ratio of 3. The sampling period (or an integration window, $T_i = T_s = 1/f_s$) provides nulls at $m*f_s$ (m is a natural number) required for an aliasing elimination function by the timing diagram of FIG. 5B.

Hereinafter, only the operation with respect to the positive input signal (Iout+) will be described by using the capacitor bank Ap 310 as an example. The operation with respect to the negative input signal (Iout−) is symmetrical to the operation with respect to the positive input signal.

The amount of charged charges in every capacitor is 0 at an initial stage.

When the switching signal As is first turned off, the circuit operates in a sampling mode. The input switching signals S1, S2, and S3 are turned on so that the output switches 317, 318, and 319 are open and the input switches 311, 312, and 313 are sequentially closed. Three charge samples are sequentially charged in the sampling capacitors 314, 315, and 316 according to these switching signals.

Subsequently, when the switching signal As is turned on, the output switches 317, 318, and 319 are closed, and the circuit enters a charge sharing mode. In this case, when a switching signal RD is turned on to close the switch 351 of the output terminal, the circuit operates in a readout mode. In this mode, the sampling capacitors 314, 315, and 316 and the capacitor 352 of the output terminal are simultaneously connected to allow the charges charged in the sampling capacitors 314, 315, and 316 to be delivered to the capacitor 352 of the output terminal. Meanwhile, an IIR filtering effect is obtained in the capacitor 352 of the output terminal.

Next, when the reset signal Ra applied to reset switches within the sampling capacitors 314, 315, and 316 is turned on, the circuit enters a reset mode to discharge charges remaining in the sampling capacitors 314, 315, and 316. If necessary, simply a global reset switch 453 may be closed, instead of the local reset signal Ra, in the reset mode to discharge the remaining charges of the sampling capacitors 314, 315, and 316.

Meanwhile, while the capacitor bank Ap 310 performs the operation of the charge sharing mode, the capacitor bank Bp 320 performs an operation of a sampling mode.

After the capacitor bank Ap 310 performs the operation of the reset mode, it performs the operation of the sampling mode again, and the capacitor bank Bp 320 performs the operation of the sampling mode and then performs the operation of the charge sharing mode. Namely, the respective capacitor banks 310 and 320 of the filter device 300 repeatedly perform the operation for filtering by rotation.

When the filter device 300 illustrated in FIG. 5A is operated according to the timing diagram of FIG. 5B, weighting factors are uniform and one output sample can be obtained for every three input samples, so a first-order sinc filter having a decimation ratio of 3 is implemented.

Figure 6A:
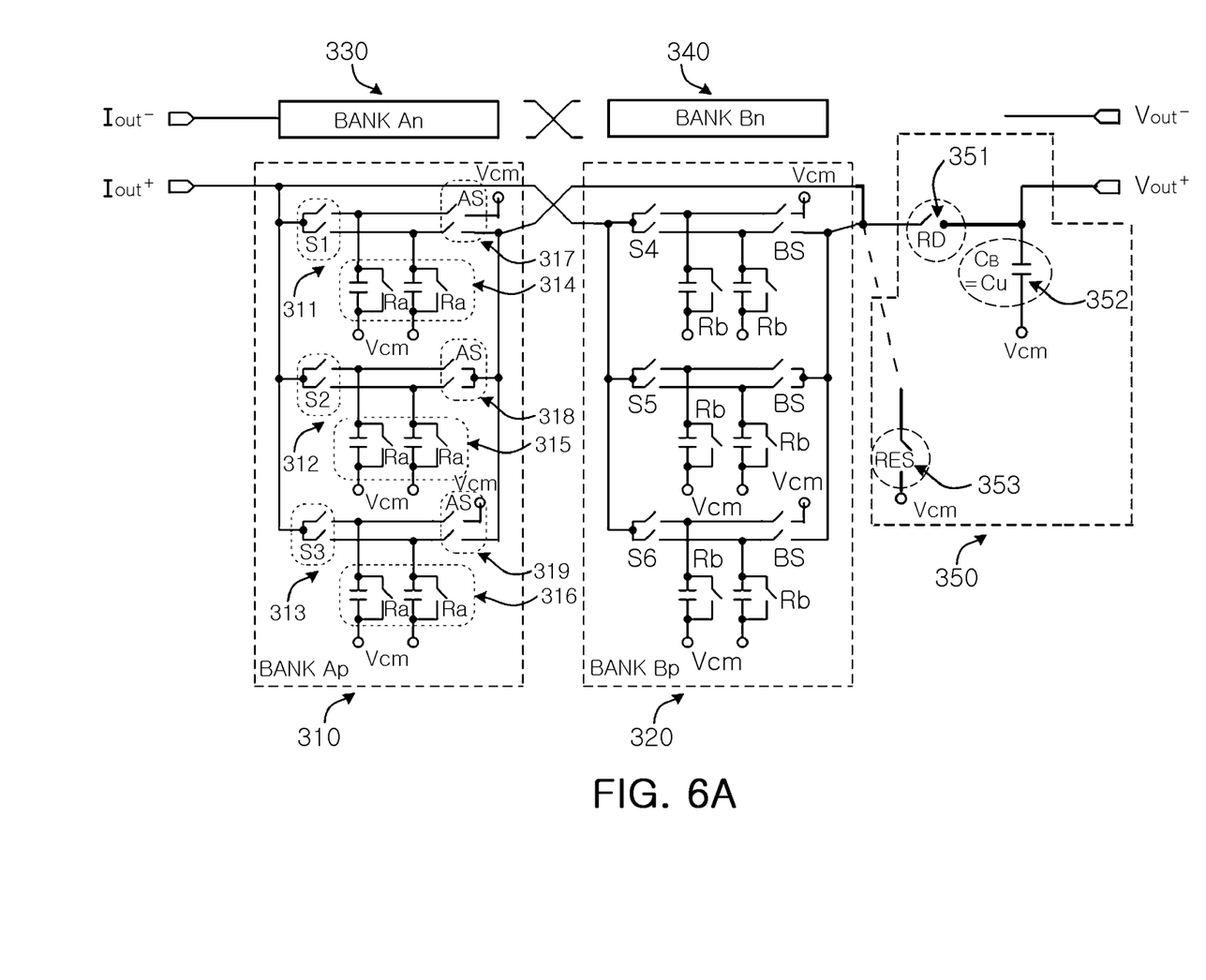
FIGS. 6A and 6B are views showing another implementation example of the filter device and a timing diagram of clocks for operating the device.

FIG. 6A is another implementation example of the filter device according to an exemplary embodiment of the present invention.

With reference to FIG. 6A, it is noted that output switches 317 to 319 are not all connected to the current paths, compared with the circuit illustrated in FIG. 5A. The capacitor terminals 314 and 316 are configured so that only one capacitor is discharged by the output switches 317 and 319.

Figure 6B:
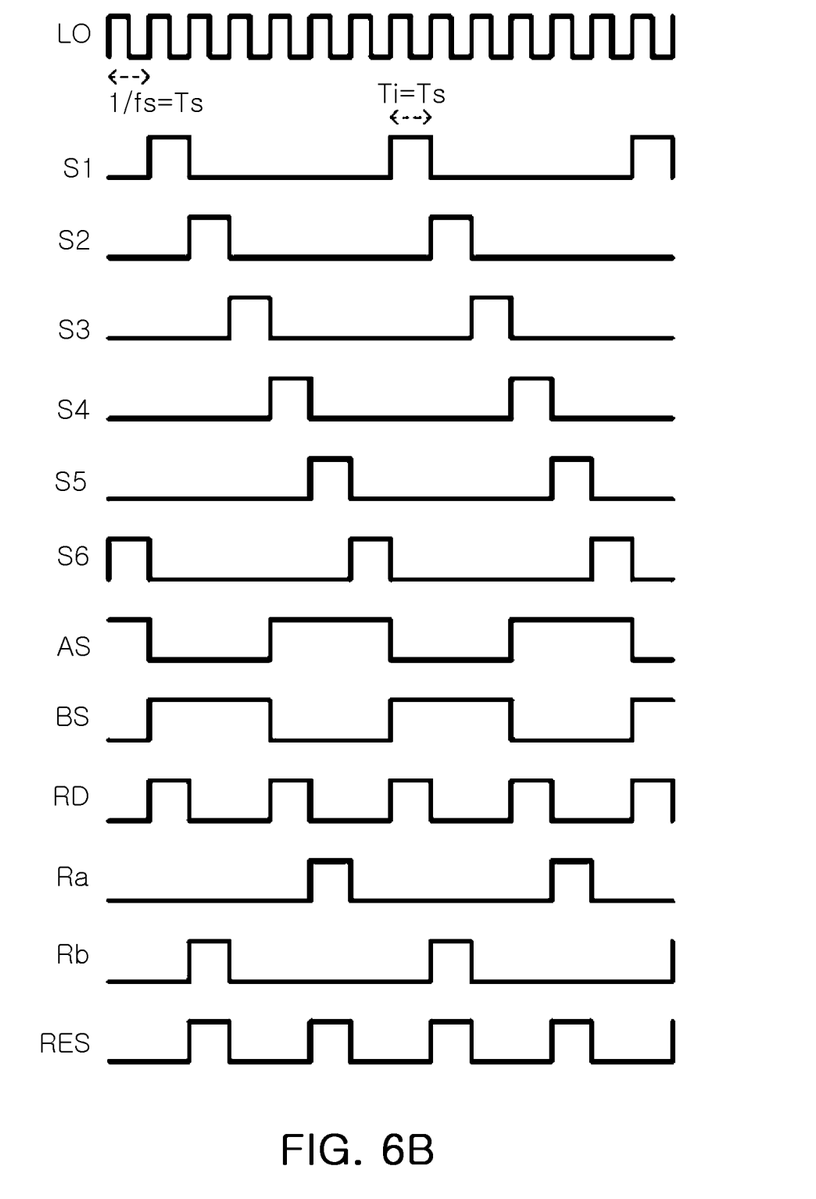

Therefore, with reference to a timing diagram of FIG. 6B, the charges stored in the capacitor bank Ap are transferred to the output terminal 350 with a weighting ratio of 1:2:1 as the output switch As is turned on. Thus, because the weightings of the respective capacitor terminals 314 and 316 are different and symmetrical, a second-order sinc filter having a decimation ratio of 3 is implemented.

Compared with the first-order sinc filter, the second-order sinc filter has a wide, deep null in terms of frequency characteristics, exhibiting excellent anti-aliasing characteristics.

Thus, the first-order sinc filter can be used when smooth pass band characteristics and relatively low noise figure and linearity specifications are required, and the second-order sinc filter may be used when strong anti-aliasing characteristics are required using more chip area and higher power consumption.

The operation of the filter device 300 will now be described with reference to the timing diagram of FIG. 6B, and only the operation with respect to the positive input signal (Iout+) will be described by using the capacitor bank Ap 310 as an example.

When the switching signal As is first turned off, the circuit operates in a sampling mode. The input switching signals S1, S2, and S3 are turned on so that the output switches 317, 318, and 319 are open and the input switches 311, 312, and 313 are sequentially closed. Three charge samples are sequentially charged in the sampling capacitors 314, 315, and 316 according to these switching signals. In particular, the two capacitors constituting the sampling capacitors 314, 315, and 316 charge the same amount of electrical charges.

Subsequently, when the switching signal As is turned on, the output switches 317, 318, and 319 are closed, and the circuit enters a charge sharing mode. In this case, when a switching signal RD is turned on to close the switch 351 of the output terminal, the circuit operates in a readout mode. In this mode, the sampling capacitors 314, 315, and 316 and the capacitor 352 of the output terminal are simultaneously connected to allow the charges charged in the sampling capacitors 314, 315, and 316 to be delivered to the capacitor 352 of the output terminal. In this case, however, the filter device 300 illustrated in FIG. 6A performs a different operation from that of the filter device 300 of FIGS. 5A and 5B. Namely, the two capacitors constituting the second sampling capacitor 315 are all connected to the capacitor 352 of the output terminal, while only one of the two capacitors constituting the first and third sampling capacitors 314 and 316, respectively, is connected to the capacitor 352 of the output terminal, while the other capacitor not connected to the capacitor 352 of the output terminal is connected to a common voltage Vcm.

Through the switching control as described above, the FIR filter coefficients of the filter device 300 have the form of 1:2:1, a triangular window form, thus implementing the second-order sinc filter of superior aliasing elimination performance.

FIGS. 5A and 5B are views showing an implementation example of a filter device and a timing diagram of clocks for operating the device; and FIGS. 6A and 6B are views showing another implementation example of the filter device and a timing diagram of clocks for operating the device.

As set forth above, in the high linearity mixer and the direct conversion receiver according to exemplary embodiments of the invention, because the frequency dependency characteristics of the conversion gain are eliminated by using an analog passive mixer, broadband characteristics can be obtained.

In addition, because the direct conversion receiver additionally includes a buffer unit, the linearity of the mixer can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A decimation filter for filtering a positive signal and a negative signal output from a mixer device, the decimation filter comprising:
    four banks performing an operation of a sampling mode to charge electric charges and an operation of a charge sharing mode to output the charges charged in the sampling mode,
    wherein the four banks include:
    a bank Ap connected to the positive signal output from the mixer device and performing the operation of the sampling mode and the operation of the charge sharing mode in a sequential and repetitive manner;
    a bank Bp connected to the bank Ap and performing the operation of the charge sharing mode when the bank Ap performs the operation of the sampling mode, and performing the operation of the sampling mode when the bank Ap performs the operation of the charge sharing mode;
    a bank An connected to the negative signal output from the mixer device and performing the operation of the sampling mode and the operation of the charge sharing mode in a sequential and repetitive manner; and
    a bank Bn connected to the bank An and performing the operation of the charge sharing mode when the bank An performs the operation of the sampling mode, and performing the operation of the sampling mode when the bank An performs the operation of the charge sharing mode.

2. The decimation filter of claim 1, wherein each of the bank Ap, the bank Bp, the bank An, and the bank Bn includes:
    three capacitor terminals including a pair of charge charging capacitors charging the charges therein during the operation of the sampling mode and a pair of charge discharging switches connected in parallel to the pair of charge charging capacitors, respectively;
    three pairs of input switches connecting and disconnecting the mixer device and the three capacitor terminals, respectively; and
    three pairs of output switches connecting and disconnecting the respective three capacitor terminals and an output terminal storing the charges output from a plurality of the banks during the operation of the charge sharing mode.

3. The decimation filter of claim 2, wherein the three pairs of input switches are delayed by one sampling period, are sequentially turned on, and sequentially charge the pair of charge charging capacitors of the three capacitor terminals with the charges, and
    the three pairs of output switches are turned on during three sampling periods and transfer the charges to the output terminal to thereby enable the charge area decimation filter to operate as a primary sinc filter having a decimation ratio of 3.

4. The decimation filter of claim 2, wherein a common voltage is connected to single switches respectively included in two pairs of output switches among the three pairs of output switches.

5. The decimation filter of claim 4, wherein the three pairs of input switches are delayed by one sampling period, are sequentially turned on, and sequentially charge the pair of charge charging capacitors with the charges, and
    the three pairs of output switches are turned on during three sampling periods and transfer the charges to the output terminal to thereby enable the charge area decimation filter to operate as a secondary sinc filter having a decimation ratio of 3.

6. The decimation filter of claim 2, wherein the output terminal includes:
    an output terminal capacitor receiving and storing the charges stored in the pair of charge charging capacitors during the operation of the charge sharing mode;
    an output terminal switch connecting and disconnecting the output terminal capacitor and the bank Ap, the bank Bp, the bank An, or the bank Bn; and
    a global reset switch discharging the charges stored in the pair of charge charging capacitors of the three capacitor terminals.

7. The decimation filter of claim 2, wherein each of the bank Ap, the bank Bp, the bank An, and the bank Bn includes two charge paths for transmitting the charges,
    the two charge paths of the bank Ap and the two charge paths of the bank Bp are cross-connected and the two charge paths of the bank An and the two charge paths of the bank Bn are cross-connected, the three capacitor terminals, the three pairs of input switches, and the three pairs of output switches of the bank Ap and the bank An are connected to one line of the two cross-connected charge paths of the bank Ap and the bank An, and the three capacitor terminals, the three pairs of input switches, and the three pairs of output switches of the bank Bp and the bank Bn are connected to the remaining line of the two cross-connected charge paths of the bank Bp and the bank Bn.

8. A direct conversion receiver comprising:

a low noise amplifier amplifying an RF signal input thereto;

a transconductance amplifier converting a voltage of the RF signal amplified by the low noise amplifier into a current signal and amplifying the current signal;

a mixer device mixing the current signal amplified by the transconductance amplifier with a local oscillation signal to generate a positive signal and a negative signal; and a decimation filter for filtering the positive signal and the negative signal output from the mixer device, wherein the decimation filter comprises four banks performing an operation of a sampling mode to charge electric charges and an operation of a charge sharing mode to output the charges charged in the sampling mode, wherein the four banks include:

a bank Ap connected to the positive signal output from the mixer device and performing the operation of the sampling mode and the operation of the charge sharing mode in a sequential and repetitive manner;

a bank Bp connected to the bank Ap and performing the operation of the charge sharing mode when the bank Ap performs the operation of the sampling mode, and performing the operation of the sampling mode when the bank Ap performs the operation of the charge sharing mode;

a bank An connected to the negative signal output from the mixer device and performing the operation of the sampling mode and the operation of the charge sharing mode in a sequential and repetitive manner; and a bank Bn connected to the bank An and performing the operation of the charge sharing mode when the bank An performs the operation of the sampling mode, and performing the operation of the sampling mode when the bank An performs the operation of the charge sharing mode.

* * * * *